United States Patent
Park et al.

(10) Patent No.: US 6,211,544 B1
(45) Date of Patent: Apr. 3, 2001

(54) MEMORY CELL LAYOUT FOR REDUCED INTERACTION BETWEEN STORAGE NODES AND TRANSISTORS

(75) Inventors: Young-Jin Park, Poughkeepsie; Carl J. Radens, LaGrangeville; Gerhard Kunkel, Fishkill, all of NY (US)

(73) Assignees: Infineon Technologies North America Corp., San Jose, CA (US); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/272,215

(22) Filed: Mar. 18, 1999

(51) Int. Cl.[7] .......................... H01L 27/108; H01L 29/76; H01L 29/94; H01L 31/119
(52) U.S. Cl. .......................... 257/296; 257/300; 257/301; 257/906; 257/907; 257/908
(58) Field of Search .................................. 257/295–312, 257/906–908; 438/243–253, 396–399

(56) References Cited

U.S. PATENT DOCUMENTS 5,998,821 * 12/1999 Hieda ................................... 257/305
6,057,187 * 5/2000 Jen et al. .............................. 257/296

* cited by examiner

*Primary Examiner*—Tom Thomas
*Assistant Examiner*—Cuong Q Nguyen
(74) *Attorney, Agent, or Firm*—Stanton C. Braden

(57) ABSTRACT

A memory cell, in accordance with the invention, includes a trench formed in a substrate, and an active area formed in the substrate below a gate and extending to the trench. The active area includes diffusion regions for forming a transistor for accessing a storage node in the trench, the transistor being activated by the gate. The gate defines a first axis wherein a portion of the active area extends transversely therefrom, the portion of the active area extending to the trench. The trench has a side closest to the portion of the active area, the side of the trench being angularly disposed relative to the gate such that a distance between the gate and the side of the trench is greater than a minimum feature size.

23 Claims, 13 Drawing Sheets

MEMORY CELL LAYOUT FOR REDUCED INTERACTION BETWEEN STORAGE NODES AND TRANSISTORS

BACKGROUND

1. Technical Field

This disclosure relates to semiconductor layouts and more particularly, to a layout for reducing interaction between storage nodes and transistors in semiconductor memory cells.

2. Description of the Related Art

Semiconductor memories such as dynamic random access memories (DRAM) typically include memory cells with storage nodes. Generally these storage nodes are formed within deep trenches etched into substrates of the semiconductor memory chip. The storage nodes are accessed using an access transistor which allows charge to be stored in the storage node or retrieves charge from the storage depending on whether the desired action is a read or write function.

In buried strap type trench capacitors, dopant outdiffusion close to a wordline can cause problems such as short channel effects in the access transistor channel.

Referring to FIG. 1, a layout is shown for conventional deep trench capacitors. Deep trench capacitors 10 are disposed under passing wordlines 12. Access transistors 14 are electrically coupled to storage nodes 16 of trench capacitors 10 through diffusion regions 18 which may be either a source or a drain of access transistors 14. Diffusion regions 20 are also included which are electrically connected to contacts 22. Contacts 22 connect to bitline (not shown) to read and write to storage nodes 16 through access transistors 14. Access transistors 14 are activated by wordlines 12. When voltage is applied to wordlines 12 a channel below wordline 12 conducts allowing current to flow between diffusion regions 18 and 20 and into or out of storage node 16.

Wordlines 12 are preferably spaced across the smallest possible distance d to conserve layout area. The smallest possible distance is typically a minimum feature size F which is achievable by the technology.

Referring now to FIG. 2 a cross-sectional view of the layout of FIG. 1 is shown. Elements of FIG. 2 are labeled as described in FIG. 1. Storage nodes 16 are isolated from a doped well 24 by a dielectric collar 26. Shallow trench isolation 28 is provided over storage nodes 16 to electrically isolate the passing wordlines 12 formed above storage nodes 16. Diffusion regions 18 of access transistors 14 are connected to storage node 16 by a node diffusion region 30 to a buried strap 32. Node diffusion 30 and buried strap 32 are typically connected by outdiffusing dopants which mix to create a conductive region (node region 30) therebetween.

In a conventional layout, the distance between wordlines 12 and buried strap 32 is usually 1F. But, if the overlay tolerance is considered, the dopant outdiffusion from buried strap 32 can potentially outdiffuse far enough to interact with a channel 34 below a gate 36 (wordline 12) causing short channel effects in access transistor 14. In typical layouts, an overlay tolerance is F/2, i.e., a worst case distance is F/2. A length of channel 34 is a function of diffusion regions 18 and 20 and buried strap 32 outdiffusion. Also, it is a function of the overlay tolerance between wordlines 12 and deep trenches 10. If the dopant outdiffusion length form buried strap 32 is larger than F/2, the length of channel 34 becomes less than 1F. However, outdiffusion form buried strap 32 must generally be far enough (about F/2) to form a connection between diffusion region 18 and buried strap 32.

As shown in phantom lines in FIG. 2, a worst case of misalignment between trench 10' and wordline 12 is shown. Further outdiffusion from buried strap 32' is such that channel length of channel 34 is reduced thereby causing short channel effects in access transistor 14.

Therefore, a need exists for a layout for semiconductor memories which reduces interaction between a buried strap and an access transistor channel.

SUMMARY OF THE INVENTION

A memory cell, in accordance with the invention, includes a trench formed in a substrate, and an active area formed in the substrate below a gate and extending to the trench. The active area includes diffusion regions for forming a transistor for accessing a storage node in the trench, the transistor being activated by the gate. The gate defines a first axis wherein a portion of the active area extends transversely therefrom, the portion of the active area extending to the trench. The trench has a side closest to the portion of the active area, the side of the trench being angularly disposed relative to the gate such that a distance between the gate and the side of the trench is greater than a minimum feature size.

A memory chip layout, in accordance with the invention, includes trenches formed in a substrate, and active areas formed in the substrate. The active areas include diffusion regions for forming transistors for accessing storage nodes in the trenches. A plurality of wordlines is disposed substantially parallel to each other, the wordlines having a width and being spaced apart by a substantially same distance. The transistors each include a gate formed by the wordlines, the wordlines defining a first axis wherein a first portion of each active area extends transversely from below the wordline to a trench disposed below an adjacent wordline. The trenches have a side closest to the first portions of the active areas, the side closest of the trench being angularly disposed relative to the wordlines such that a distance between a wordline and a side closest to the first portion of a trench, disposed below an adjacent wordline, is greater than the substantially same distance between the wordlines.

Another memory chip layout includes trenches, and active areas formed in a substrate, the active areas including diffusion regions for forming transistors for accessing storage nodes in the trenches. A plurality of wordlines are disposed substantially parallel to each other, the wordlines having a width and being spaced apart by a substantially same distance. The transistors each include a gate formed by the wordlines, the wordlines defining a first axis wherein a first portion of each active area extends transversely from below the wordline to a trench disposed below an adjacent wordline. The trenches have a side closest to the first portions of the active areas, the side closest to the first portions being angularly disposed relative to the wordlines such that a distance between the wordline and the side closest to the first portions, disposed below an adjacent wordline, is greater than the substantially same distance between the wordlines. The active areas define a second axis which forms an angle with the wordlines and extends below two adjacent wordlines to connect to trenches at ends of the active areas. The trenches disposed below the two adjacent wordlines have at least on side aligned in a substantially parallel orientation relative to the second axis.

In alternate embodiments, the active areas may form an angle with the first axis such that a channel length of a channel of the access transistor disposed below the gate is greater than a width of the gate or wordlines. The trenches may have a shape including one of a rectangle, a trapezoid, a parallelogram and/or a bent rectangle. The portion (or first portion) of the active area may include a bend to further extend the distance between the gate and the side of the trench. The gate and/or the wordlines may include a width of greater than the minimum feature size to provide a longer channel length. The gate may include the width of greater than the minimum feature size only over the channels of the access transistors. The gate includes a width of the minimum feature size. The trenches below adjacent wordlines may be at least a minimum feature size apart. Pairs of wordlines adjacent on each side of the two wordlines may have active areas forming an angle opposite the rotation of the angles formed by active areas on the two wordlines, the trenches below the adjacent pairs having at least one side substantially parallel to the active areas of the adjacent pairs of wordlines and forming an angle opposite the rotation of the angles formed by active areas on the two wordlines.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention relates to semiconductor layouts and more particularly, to a layout for reducing interaction between storage nodes and transistors in semiconductor memory cells. The invention includes layouts for deep trench capacitors and active regions such that a greater distance between the storage node and the wordline below which exists a transistor channel is realized. By providing the additional distance between the buried strap and the wordline, outdiffusion from a buried strap into the channel may be prevented and short channel effects avoided. The invention further includes additional embodiments which provide increased distance between the buried strap and the wordline. The present invention is applicable to memory cells and in particular to dynamic random access memory (DRAM) cells. Other memory devices are also contemplated by the invention.

Figure 3:
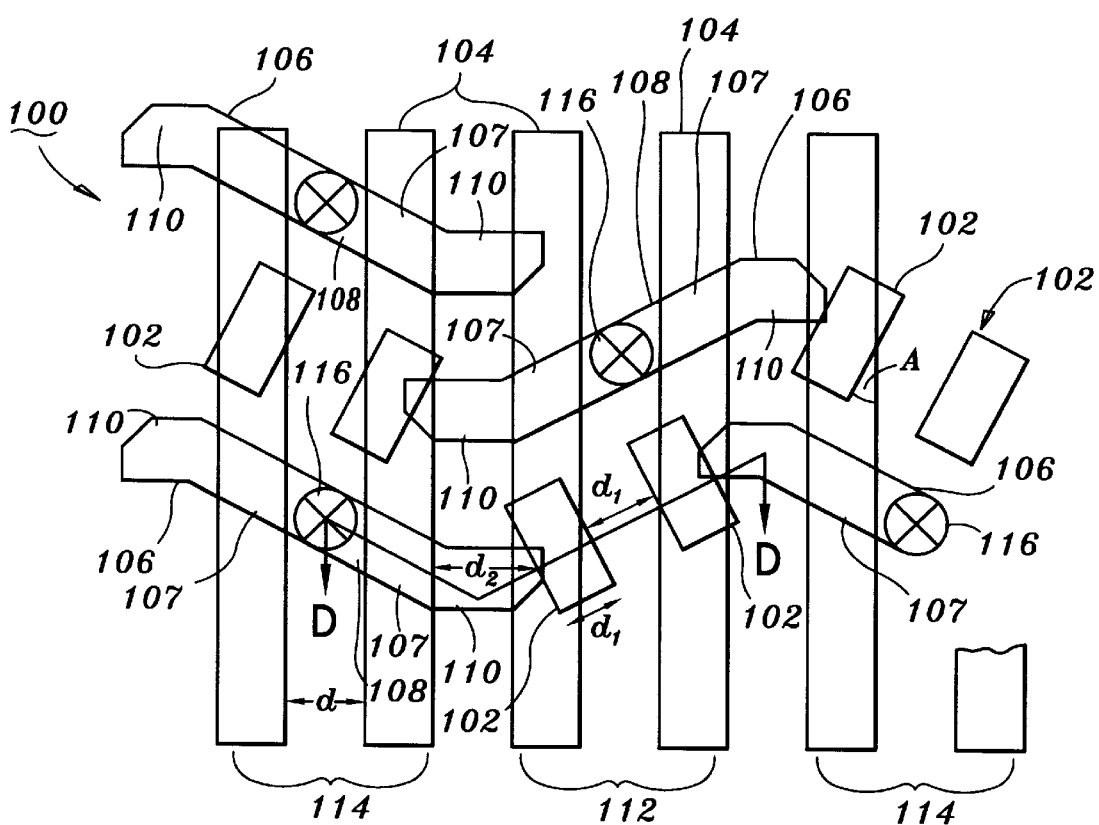
FIG. 3 is a top plan view of a memory cell layout for a memory device showing angled rectangular trenches and active areas in accordance with the present invention.

Referring now in specific detail to the drawings in which like reference numerals identify similar or identical elements throughout the several views, and initially to FIG. 3, a layout is shown for a semiconductor memory 100. Memory 100 includes deep trenches 102 and wordlines (gates) 104. Wordlines 104 are preferably spaced apart by a distance d, for example, the minimum feature size F. Further, wordlines preferably have a thickness of about F as well. Active areas 106 include a source region and a drain region on opposite side of each wordline 104. It is to be understood that the FIGS. include depictions of layouts with overlapping elements. These elements are provided on a plurality of different levels. For example, trenches are formed in a semiconductor substrate, active areas are diffused into the substrate and contacts and gate/wordlines are formed on the substrate.

In accordance with the present invention, trenches 102 are disposed such that an angle A is formed between trenches 102 and wordlines 104. This angular orientation provides additional length between trenches 102 and wordline 104. FIG. 3 shows a dimension $d_2$ which represents a distance between wordline 104 and a closest side of a trench capacitor 102. In accordance with the invention, $d_2$ is greater than d. In a preferred embodiment, $d_2$ is greater than F. Active areas 106 are likewise disposed in an angular relationship with wordlines 104. In one embodiment, active regions 106 have an angled portion 108 and a portion 110 substantially perpendicular to wordlines 104. According to this layout a minimum distance between trenches 102 and the same width for trenches 102 are maintained as shown by $d_1$. $d_1$ is preferably substantially equal to F.

As shown in FIG. 3, the layout achieves spatial efficiency by repeating the angled pattern for angled portions 108 of active areas 104 on a given pair 112 of wordlines. Adjacent pairs 114 provide a similar pattern. However, the pattern is rotated in a direction opposite that of angled portions 108 of active areas 104 on wordline pair 112. Trenches 102 associated with each wordline pair (112 and 114) are aligned along angled portions 108 of the associated wordline pair (112 and 114). In preferred embodiments, trenches 102 form an angle A of greater than 0 degrees to about 45 degrees with wordlines 104. Angled portions 108 of active areas 106 form a herringbone-type pattern to efficiently layout components such as trenches 102 and contacts 116

Figure 1:
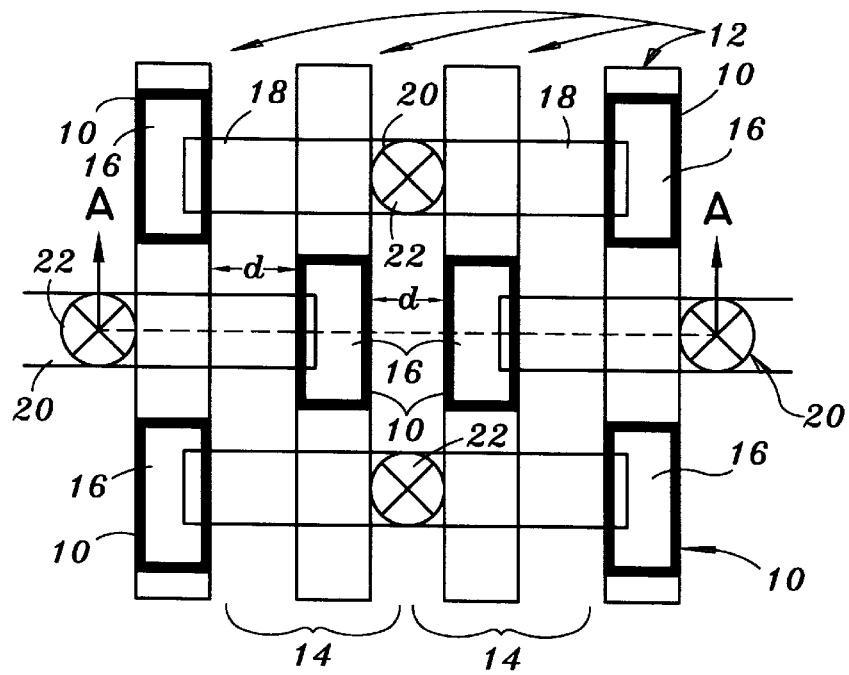
FIG. 1 is a top plan view of a memory cell layout of a conventional memory device in accordance with the prior art.
Figure 2:
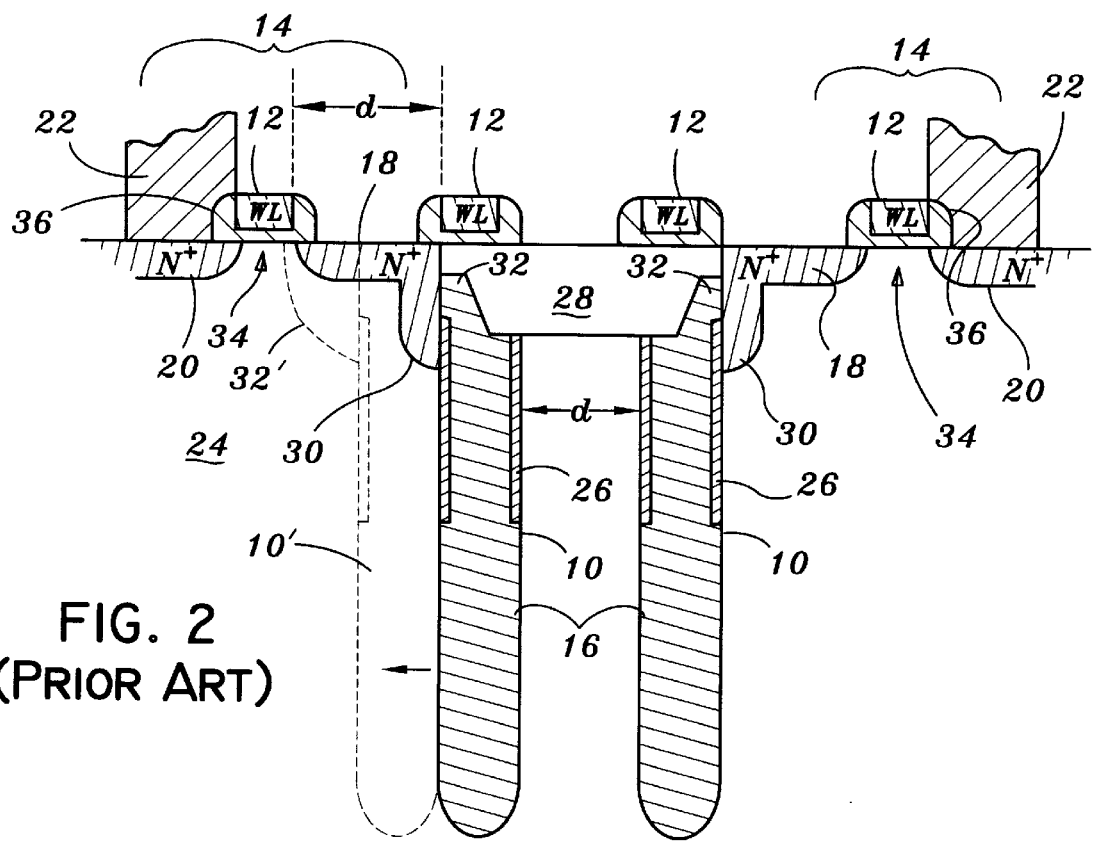
FIG. 2 is a cross-sectional view taken at section line A—A of FIG. 1 for the memory cell in accordance with the prior art.

Portion 110 of active area 106 is extended to a value greater than F. This reduces dopant interaction between buried strap (32 of FIG. 2) of trenches 102 and wordlines 104 by permitting a longer average distance therebetween. Advantageously, a greater distance (greater than F) is realized between trenches 102 and bitline contacts 116. Further, even in a worst can overlay margin (tolerance) of F/2, the present invention still provides an adequate distance between buried strap (32 of FIG. 2) of trenches 102 and wordlines 104. A channel region 107 below wordlines 104 is also increased by angled portions 108 thereby reducing short channel effects in access transistors.

Figure 4:
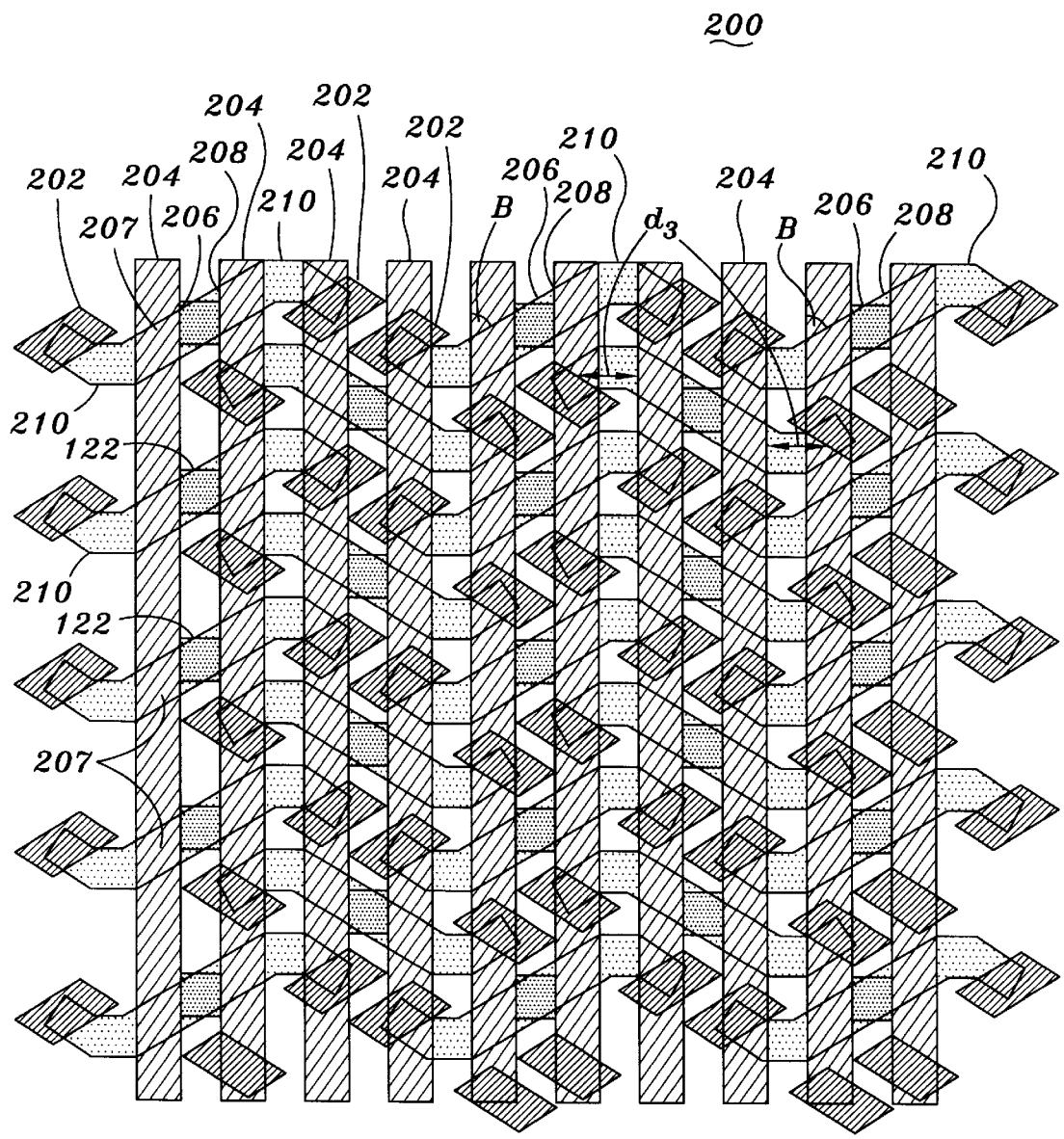
FIG. 4 is a top plan view of another memory cell layout for a memory device showing angled parallelogram trenches and active areas in accordance with the present invention.
Figure 5:
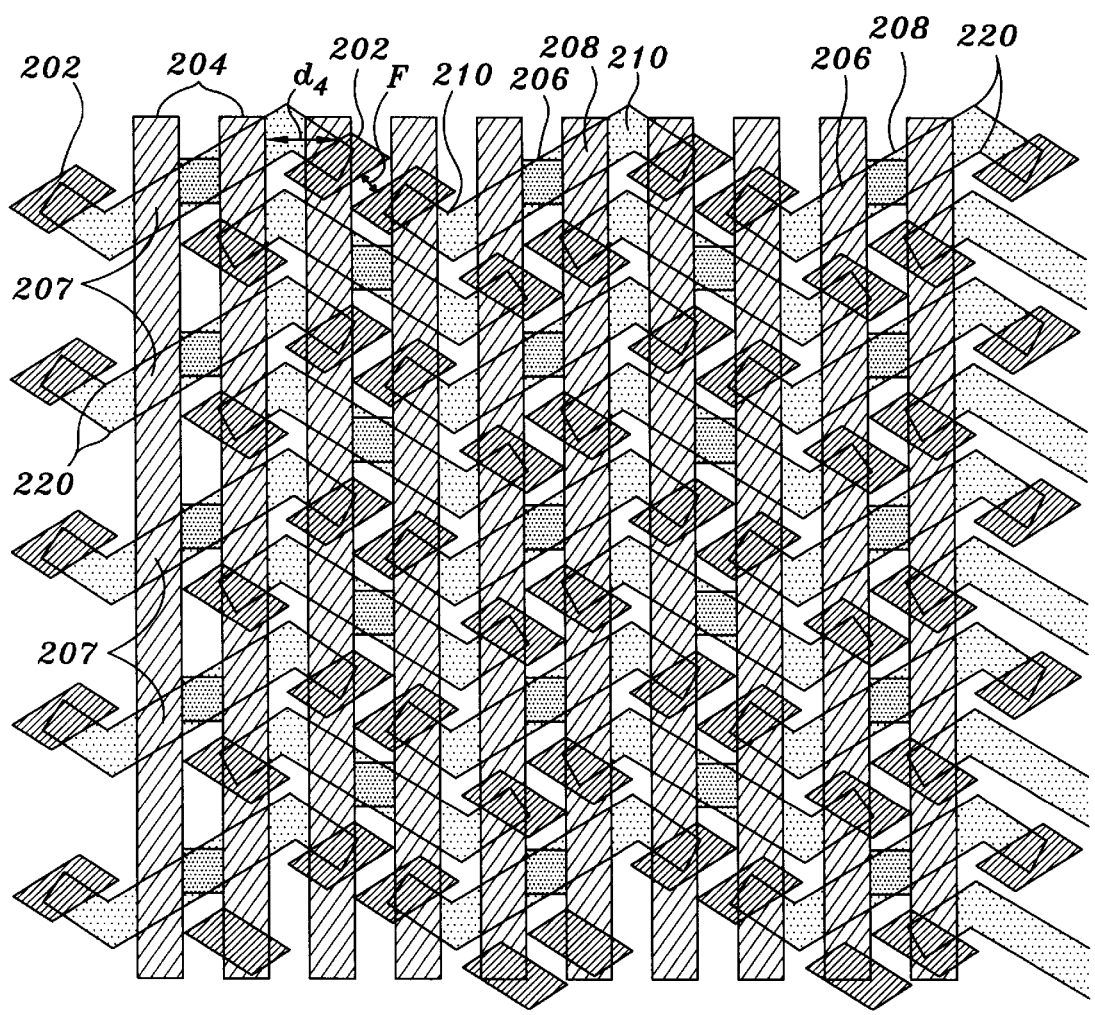
FIG. 5 is a top plan view of the memory cell layout for the memory device of FIG. 4 showing angled parallelogram trenches and active areas where the active areas include corners in accordance with the present invention.

Referring to FIG. 4, an alternate layout in accordance with the present invention is shown. Trenches 202 are shaped in the form of a parallelogram. This is to maintain the substantially parallel alignment of trenches 202 with angled portions 208 of active areas 206. Wordlines 204 are oriented in a substantially parallel manner as before. The parallelogram shapes of trenches 202 permit increased memory cell density across memory chip 200. In this embodiment, angled portions 208 form an angle B between wordlines 204. Angle B may be greater than 0 degrees to about 60 degrees. The angles of the parallelogram formed by trenches 202 will shift appropriately in accordance to the active region 206 orientation. Angled portions 208 of active areas 206 connect to portions 210 which are substantially perpendicular to wordlines 204. Portions 210 connect to trenches 202 (through the buried strap). A distance $d_3$ between a wordline 204 and trench 202 is greater than or equal to F, the minimum feature size in accordance with the invention. The average distance across portion 210 is greater than F. As shown in FIG. 5, a distance $d_4$ between a wordline 204 and trench 202 is greater than F, the minimum feature size in accordance with the invention. The average distance across portion 210 is greater than F, and the distance between all points of trench 202 and wordline 204 is greater than F. This is achieved by maintaining cornered bends 220 of active areas 206 which force the distance of all points between trenches 202 and wordlines 204 in active areas 206 to be greater than F. In FIGS. 4 and 5, trenches 202 are spaced apart by about F on sides opposite active areas 206. Bitline contacts 122 are shown in FIGS. 4 and 5. A channel region 207 below wordlines 204 is also increased by angled portions 208 thereby reducing short channel effects in access transistors.

Figure 6:
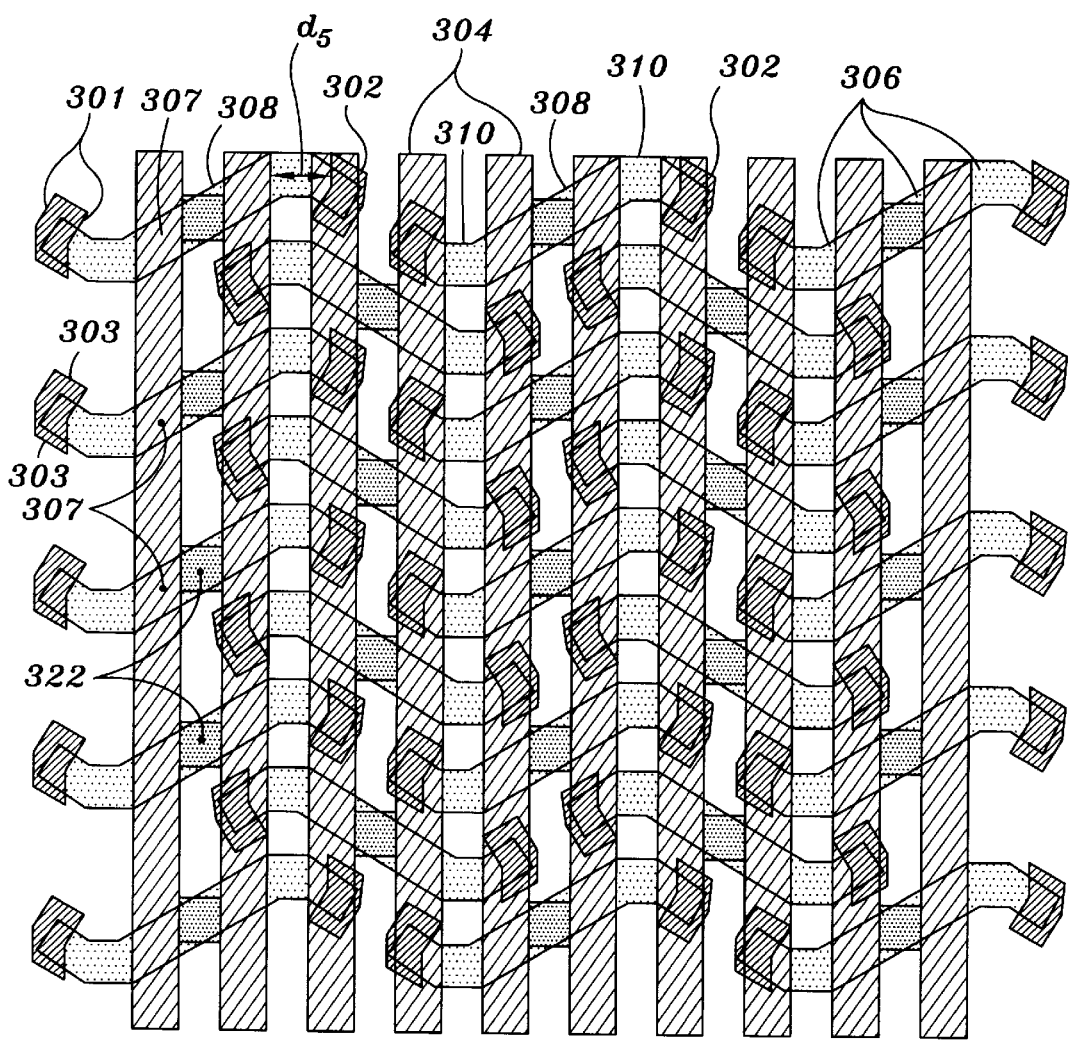
FIG. 6 is a top plan view of another memory cell layout for a memory device showing angled bent rectangles for trenches and angled active areas in accordance with the present invention.
Figure 7:
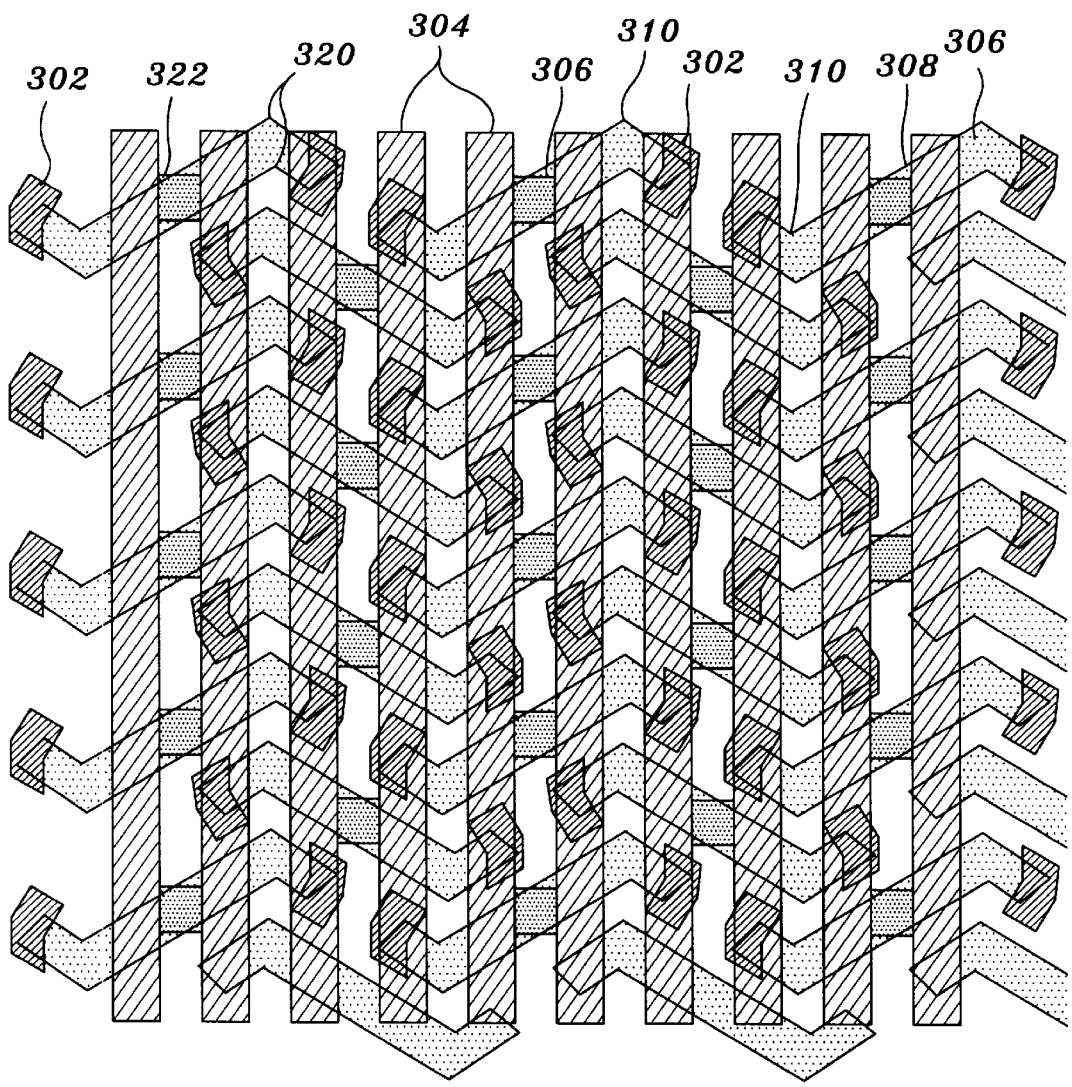
FIG. 7 is a top plan view of the memory cell layout for the memory device of FIG. 6 showing angled bent rectangles trenches and angled active areas where the active areas include corners in accordance with the present invention.

Referring to FIGS. 6 and 7, another embodiment of the present invention employs trenches 302 with bent or arcuate shaped sides 301, and straight sides 303 which are substantially parallel to angled portions 308 of active areas 306. By employing this shaped trench 302, a distance $d_5$ is maintained greater than F for all points of portions 310 between wordlines 304 and trenches 302. Further, by employing the trenches 302 having the shape shown in FIGS. 6 and 7 more distance is gained between wordline 304 and trenches 302 thereby permitting increased overlay margin (tolerance). A channel region 307 below wordlines 304 is also increased by angled portions 308 thereby reducing short channel effects in access transistors. In FIGS. 6 and 7, trenches 302 are spaced apart by about F on sides opposite active areas 306. Bitline contacts 322 are also shown. FIG. 7 includes the advantages of corners 320 of portions 310 of active areas 306.

Figure 8:
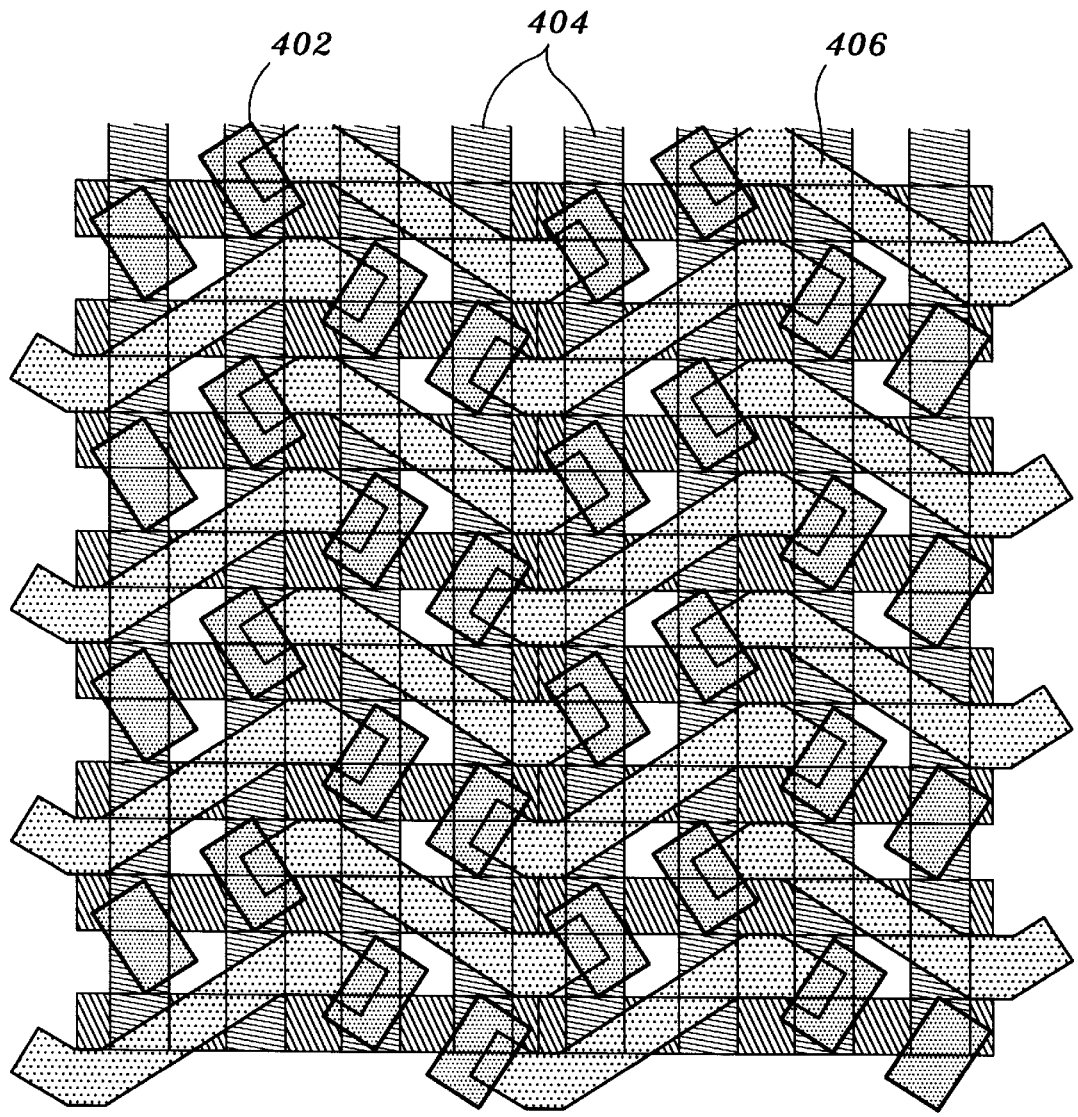
FIG. 8 is a top plan view of another memory cell layout for a memory device showing angled rectangle trenches and angled active areas and wider wordlines to provide larger trenches in accordance with the present invention.
Figure 9:
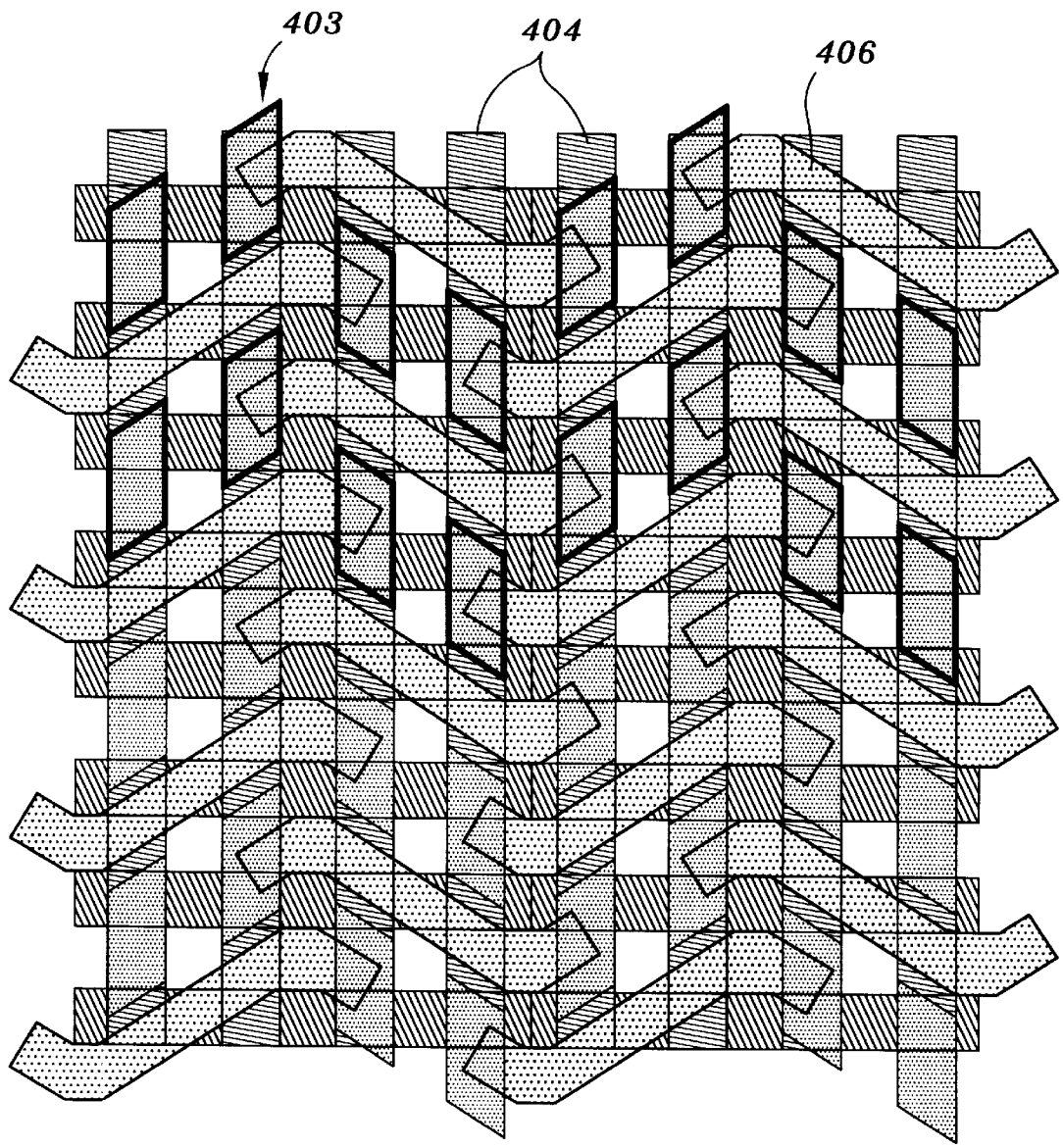
FIG. 9 is a top plan view of another memory cell layout for a memory device showing angled parallelogram trenches and angled active areas and wider wordlines to provide larger trenches in accordance with the present invention.
Figure 10:
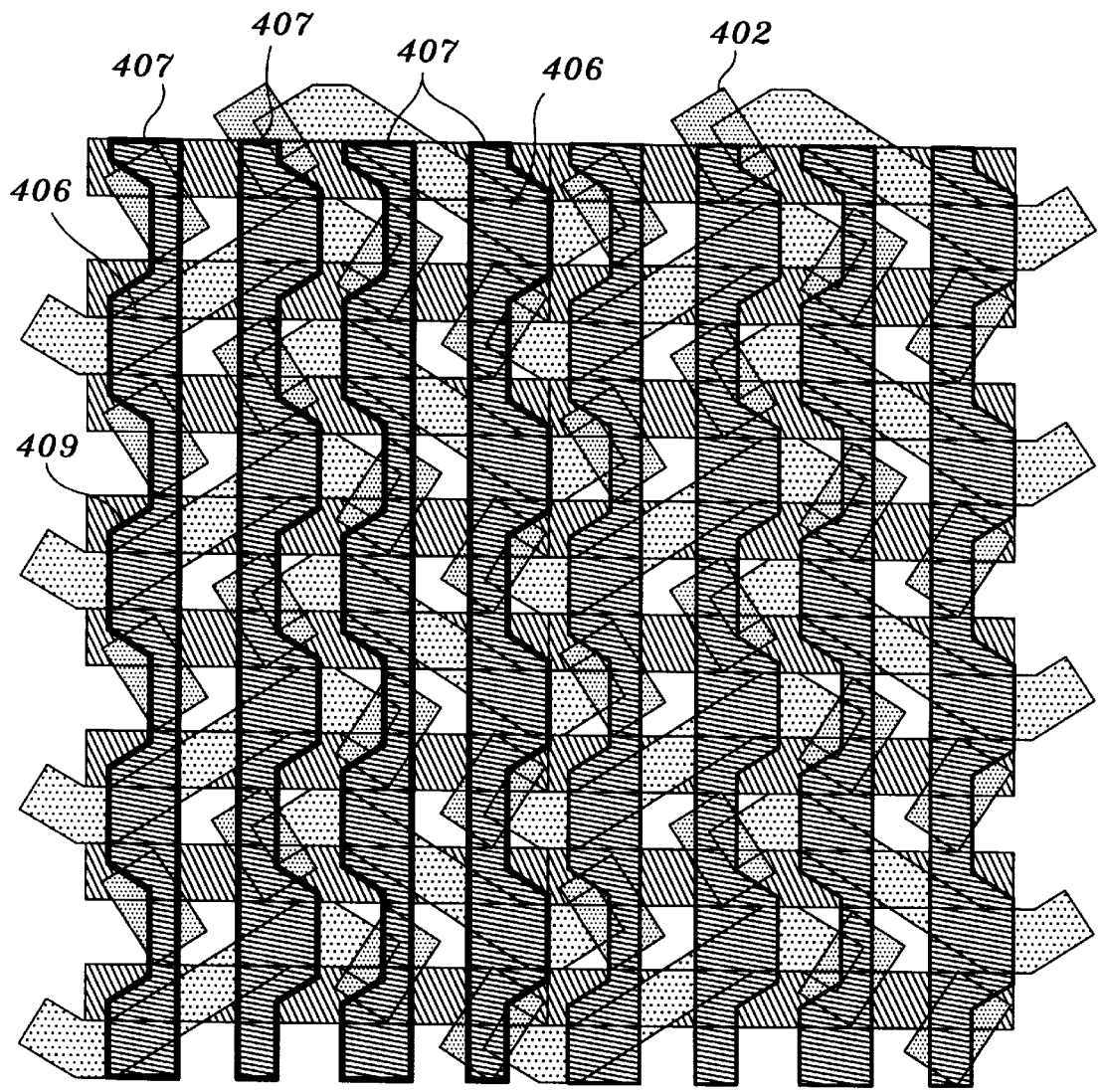
FIG. 10 is a top plan view of another memory cell layout for a memory device showing angled rectangle trenches and angled active areas and wider wordlines only over transistor channels to extend the channels in accordance with the present invention.
Figure 11:
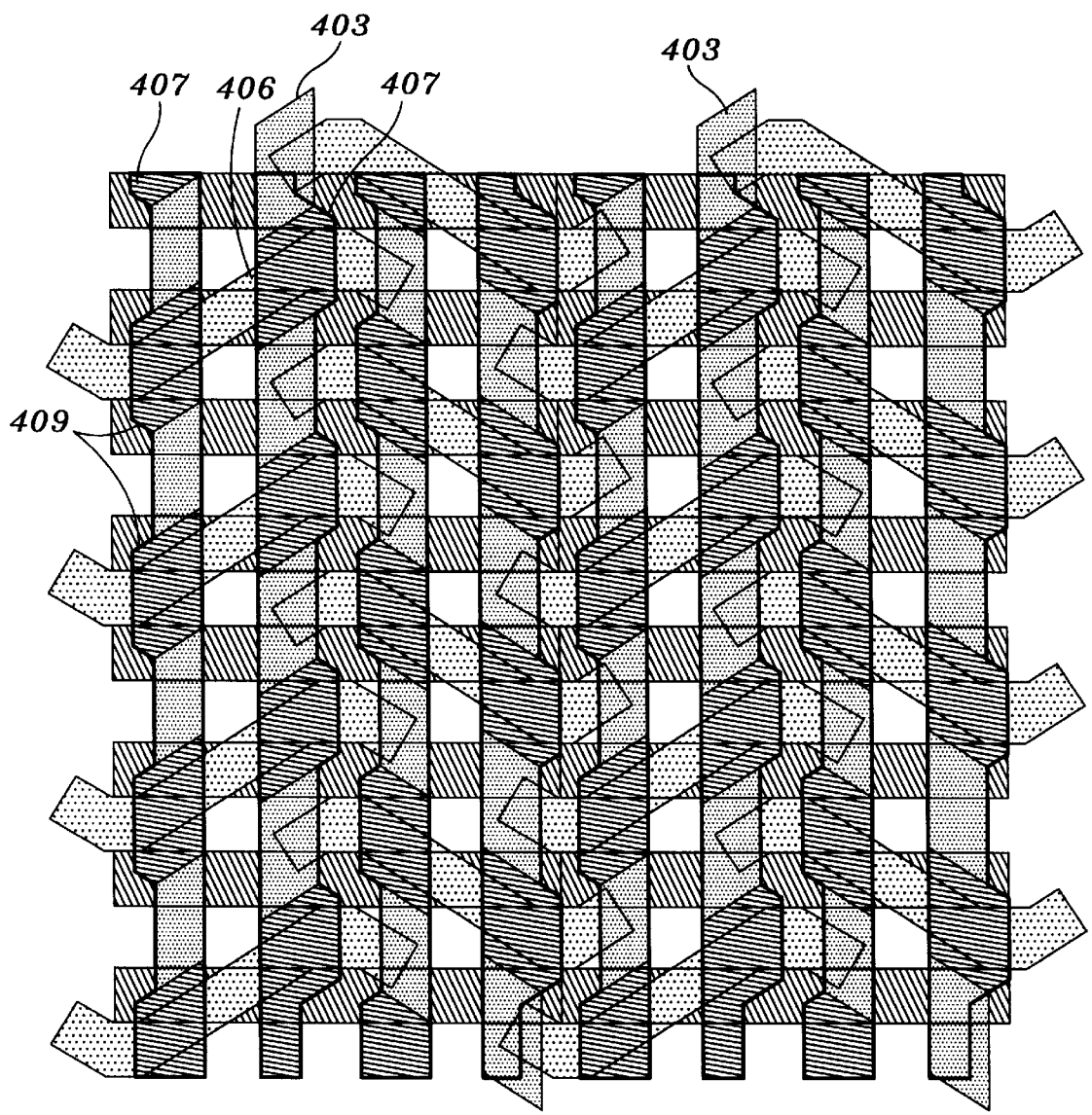
FIG. 11 is a top plan view of another memory cell layout for a memory device showing angled parallelogram trenches and angled active areas and wider wordlines only over transistor channels to extend the channels in accordance with the present invention.

As shown in FIG. 8, trenches 402 may be angled to optimize or increase the trench area, i.e., to provide larger trenches. As shown in FIG. 9, trenches 403 may slanted to provide a more efficient and larger layout area. For both, FIGS. 8 and 9, wordlines 404 may be thicker to increase the area of the trench and provide a larger channel length of a transistor channel 406 below wordlines 404. To further increase channel length of channel 406, wordlines 407 may be widened in appropriate places as shown in FIGS. 10 and 11. Wordlines 407 have a wiggle or "toothed" appearance to provide expanded portions 409 over channels 406 to increase channel length.

Figure 12:
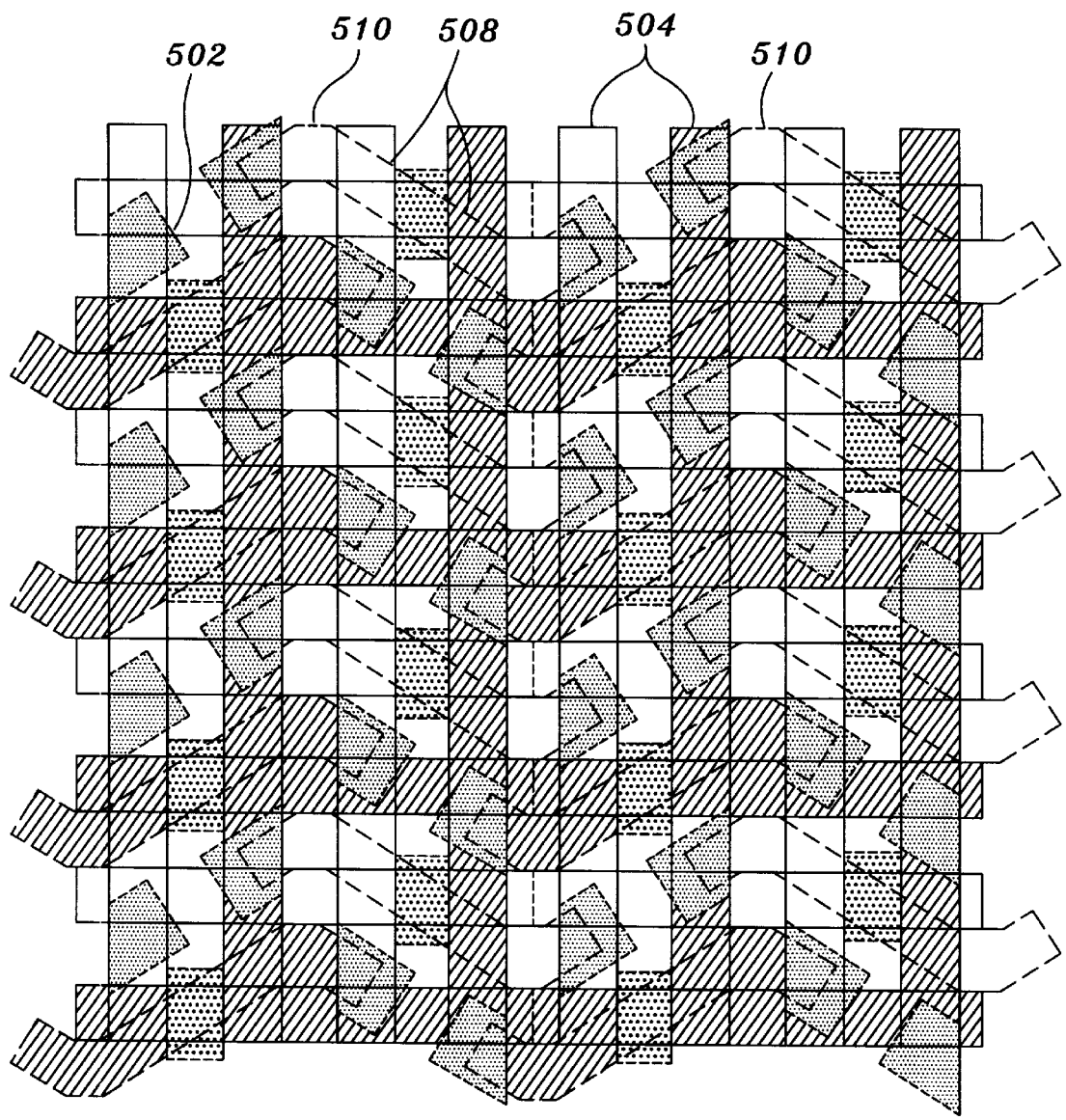
FIG. 12 is a top plan view of another memory cell layout for a memory device showing angled trapezoidal trenches and active areas in accordance with the present invention.
Figure 13:
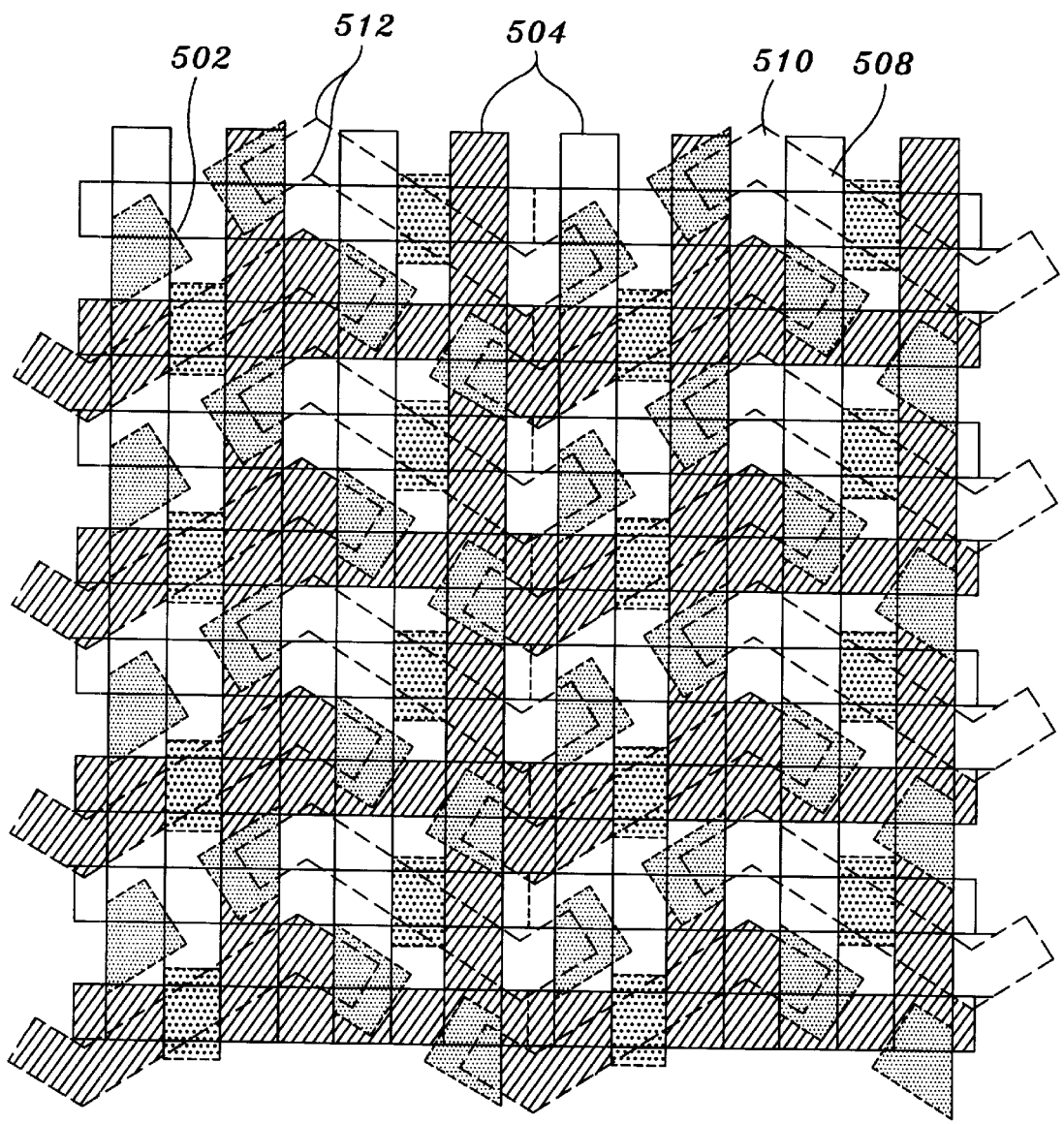
FIG. 13 is a top plan view of the memory cell layout for the memory device of FIG. 12 showing angled trapezoidal trenches and active areas where the active areas include corners in accordance with the present invention.

Referring to FIGS. 12 and 13, other trench shapes are contemplated by the present invention. For example, trapezoids may be employed for trenches 502 along with angled portions 508 of active areas 506. Portions 510 may include corners 512 as described above. Wordlines are labeled as 504.

Figure 14:
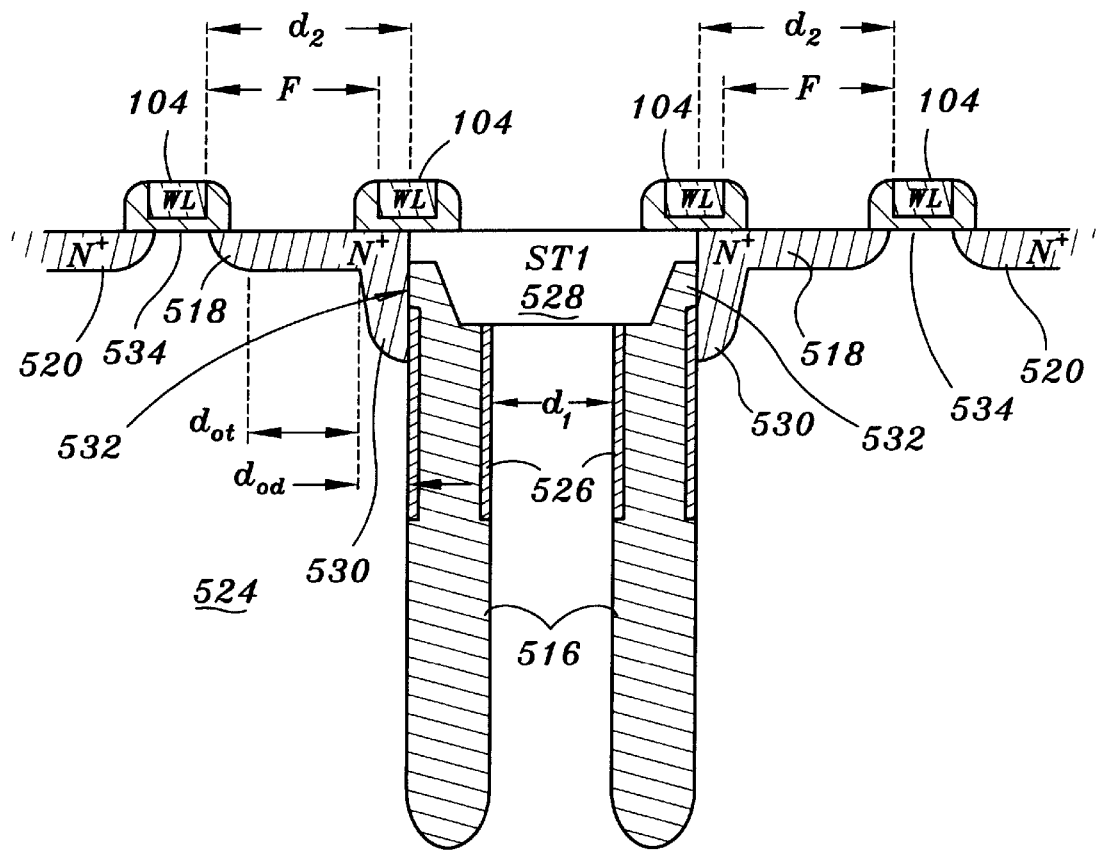
FIG. 14 is a cross-sectional view taken at section line D—D of FIG. 3 for the memory cell in accordance with the present invention.

Referring now to FIG. 14, a cross-sectional view of the layout of FIG. 3 is shown. Storage nodes 516 are isolated from a doped well 524 by a dielectric collar 526. Shallow trench isolation 528 is provided over storage nodes 516 to electrically isolate the passing wordlines 104 formed above storage nodes 516. Diffusion regions 518 (portions 110 of active areas 106) of access transistors 514 are connected to storage node 516 by a node diffusion region 530 to a buried strap 532. Node diffusion 530 and buried strap 532 are connected by outdiffusing dopants which mix to create a conductive region (node region 530) therebetween.

In accordance with one embodiment of the invention, the distance between wordlines 104 and buried strap 532 is greater than F. The dopant outdiffusion from buried strap 532 cannot outdiffuse far enough to interact with a channel 534 below a gate 536 (wordline 104) thereby preventing short channel effects in access transistor 514. For a maximum overlay tolerance of $d_{ot}$=F/2, and a outdiffusion length of, say $d_{od}$=F/2, the present invention advantageously leaves margin between wordline 104 and diffusion regions 518 and 520 and buried strap 532 outdiffusion. $d_1$ may be maintained at F. If the dopant outdiffusion length from buried strap 532 is larger than F/2, channel 534 still has margin due to the fact that the distance $d_2$ is increased according to the invention. $d_2$ can be larger as described in accordance with the various embodiments and combinations thereof.

Having described preferred embodiments for memory cell layout for reduced interaction between storage nodes and transistors (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A memory cell comprising:

a trench formed in a substrate;

an active area formed in the substrate below a gate and extending to the trench, the active area including diffusion regions for forming a transistor for accessing a storage node in the trench, the transistor being activated by the gate;

the gate defining a first axis wherein a portion of the active area extends transversely therefrom, the portion of the active area extending to the trench; and the trench having a side closest to the portion of the active area, the side of the trench being angularly disposed relative to the gate such that a distance between the gate and the side of the trench is greater than a minimum feature size.

2. The memory cell as recited in claim 1, wherein the active areas form an angle with the first axis such that a channel length of a channel of the access transistor disposed below the gate is greater than a width of the gate.

3. The memory cell as recited in claim 1, wherein the trenches have a shape of one of a rectangle, a trapezoid, a parallelogram and a bent rectangle.

4. The memory cell as recited in claim 1, wherein the portion of the active area includes a bend to further extend the distance between the gate and the side of the trench.

5. The memory cell as recited in claim 1, wherein the gate includes a width of greater than the minimum feature size to provide a longer channel length.

6. The memory cell as recited in claim 5, wherein the gate includes the width of greater than the minimum feature size only over the channels of the access transistors.

7. The memory cell as recited in claim 1, wherein the gate includes a width of the minimum feature size.

8. A memory chip layout comprising:

trenches formed in a substrate;

active areas formed in the substrate, the active areas including diffusion regions for forming transistors for accessing storage nodes in the trenches;

a plurality of wordlines disposed substantially parallel to each other, the wordlines having a width and being spaced apart by a substantially same distance, the transistors each including a gate formed by the wordlines, the wordlines defining a first axis wherein a first portion of each active area extends transversely from below the wordline to a trench disposed below an adjacent wordline; and the trenches having a side closest to the first portions of the active areas, the side closest to the trench being angularly disposed relative to the wordlines such that a distance between the wordline and the side closest to the trench for a trench disposed below and adjacent wordlines is greater than the substantially same distance between the wordlines.

9. The memory chip layout as recited in claim 8, wherein the active areas form an angle with the first axis such that a channel length of channels of the access transistor disposed below the wordlines are greater than the width of the wordlines.

10. The memory chip layout as recited in claim 8, wherein the trenches have a shape of one of a rectangle, a trapezoid, a parallelogram and a bent rectangle.

11. The memory chip layout as recited in claim 8, wherein the first portion of the active area includes a bend to further extend the distance between the gate and the side closest to the trench.

12. The memory chip layout as recited in claim 8, wherein the width of the wordlines is greater than the minimum feature size to provide a longer channel length for the transistor.

13. The memory chip layout as recited in claim 13, wherein the width is of greater than the minimum feature size only over the channels of the access transistors.

14. The memory chip layout as recited in claim 8, wherein the width and the substantially same distance are about the minimum feature size.

15. A memory chip layout comprising:

trenches formed in a substrate;

active areas formed in the substrate, the active areas including diffusion regions for forming transistors for accessing storage nodes in the trenches;

a plurality of wordlines disposed substantially parallel to each other, the wordlines having a width and being spaced apart by a substantially same distance, the transistors each including a gate formed by the wordlines, the wordlines defining a first axis wherein a first portion of each active area extends transversely from below the wordline to a trench disposed below an adjacent wordline;

the trenches having a side closest to the first portions of the active areas, the side closest to the first portions being angularly disposed relative to the wordlines such that a distance between a wordline and a side closest to the first portions for a trench, disposed below an adjacent wordline, is greater than the substantially same distance between the wordlines; and the active areas defining a second axis which forms an angle with the wordlines and extends below two adjacent wordlines to connect to trenches at ends of the active area, the trenches disposed below the two adjacent wordlines having at least on side being aligned in a substantially parallel orientation relative to the second axis.

16. The memory chip layout as recited in claim 15, wherein the active areas form an angle with the first axis such that a channel length of channels of the access transistor disposed below the wordlines are greater than the width of the wordlines.

17. The memory chip layout as recited in claim 15, wherein the trenches have a shape of one of a rectangle, a trapezoid, a parallelogram and a bent rectangle.

18. The memory chip layout as recited in claim 15, wherein the first portion of the active area includes a bend to further extend the distance between the gate and the side closest to the trench.

19. The memory chip layout as recited in claim 15, wherein the width of the wordlines is greater than the minimum feature size to provide a longer channel length for the transistor.

20. The memory chip layout as recited in claim 19, wherein the width is greater than the minimum feature size only over the channels of the access transistors.

21. The memory chip layout as recited in claim 15, wherein the width and the substantially same distance are about the minimum feature size.

22. The memory chip layout as recited in claim 15, wherein the trenches below adjacent wordlines are at least a minimum feature size apart.

23. The memory chip layout as recited in claim 15, wherein pairs of wordlines adjacent on each side of the two wordlines have active areas forming an angle opposite the rotation of the angles formed by active areas on the two wordlines, the trenches below the adjacent pairs having at least one side substantially parallel to the active areas forming an angle opposite the rotation of the angles formed by active areas on the two wordlines.

* * * * *